US007206984B2

(12) United States Patent
Anzou

(10) Patent No.: US 7,206,984 B2
(45) Date of Patent: Apr. 17, 2007

(54) BUILT-IN SELF TEST CIRCUIT AND TEST METHOD FOR STORAGE DEVICE

(75) Inventor: Kenichi Anzou, Kanagawa (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 231 days.

(21) Appl. No.: 11/089,232

(22) Filed: Mar. 23, 2005

(65) Prior Publication Data

US 2005/0278595 A1 Dec. 15, 2005

(30) Foreign Application Priority Data

Jun. 14, 2004 (JP) ............................ P2004-175881

(51) Int. Cl.
*G01R 31/28* (2006.01)

(52) U.S. Cl. ...................... 714/733; 714/719; 714/723

(58) Field of Classification Search ................ 365/201; 714/30, 744, 718, 738, 733, 719, 723
See application file for complete search history.

(56) References Cited

U.S. PATENT DOCUMENTS

| 6,343,366 | B1 * | 1/2002 | Okitaka ....................... 714/733 |
| 6,359,818 | B2 * | 3/2002 | Suzuki ........................ 365/201 |
| 6,643,807 | B1 * | 11/2003 | Heaslip et al. .............. 714/719 |
| 6,728,916 | B2 * | 4/2004 | Chen et al. .................. 714/733 |
| 6,829,728 | B2 * | 12/2004 | Cheng et al. ................. 714/30 |
| 7,036,064 | B1 * | 4/2006 | Kebichi et al. ............. 714/744 |

FOREIGN PATENT DOCUMENTS

JP 2004-022095 1/2004

* cited by examiner

*Primary Examiner*—David Ton
(74) *Attorney, Agent, or Firm*—DLA Piper US LLP

(57) ABSTRACT

A built-in self test circuit includes a capture register storing data transmitted from a memory device, an operation controller controlling operation of the memory device and the capture register, a hold controller executing a hold operation to stop a read operation and a write operation of the memory device by transmitting a hold signal to the operation controller, and a test control circuit controlling the operation controller to transmit a capture signal so that the capture register stores the data to the capture register.

6 Claims, 9 Drawing Sheets

BUILT-IN SELF TEST CIRCUIT AND TEST METHOD FOR STORAGE DEVICE

CROSS REFERENCE TO RELATED APPLICATIONS AND INCORPORATION BY REFERENCE

This application is based upon and claims the benefit of priority from prior Japanese patent application P2004-175881 filed on Jun. 14, 2004; the entire contents of which are incorporated by reference herein.

BACKGROUND OF THE INVENTION

1. Field of the Invention

The present invention relates to a built-in self test circuit and a test method for a storage device embedded in a semiconductor integrated circuit.

2. Description of the Related Art

A method of building a built-in self test (Referred to as "BIST" hereinafter) circuit into a semiconductor integrated circuit and using the BIST to detect manufacturing defects of memory devices, in shipping tests of semiconductor integrated circuits, is generally performed. As a method of detecting defects using the BIST, BIST circuits with compactors, which compact output data of the memory devices, subsequently provide compacted results to an LSI tester, and determine whether or not the semiconductor integrated circuit is defective, exist. As another method of detecting defects using the BIST, BIST circuits with comparators, which compare output data with the expected value generated in the BIST circuit, also exist.

Further, a fault diagnosis, which analyzes fault locations in a memory device, is also performed using the BIST circuit. In a case in which defects have been detected in the BIST, operation of the BIST is stopped in order to perform the fault diagnosis, and output data at the address at which a defect has been detected is output to an external LSI tester as diagnostic data.

Generally, on BIST, first "0" or "1" is written into all memory cells of the memory devices on which testing is performed, and afterward, memory output is observed and analyzed for defect detection. For example, in a system which uses a test algorithm termed 13N march, in a case in which, first, "0" has been written into all memory cells, "0" reading operation, "1" write operation, and "1" reading operation is performed for each address. On comparator-type BIST, data that has been read is stored in a register, and the BIST and fault diagnosis is performed by comparing the data stored in the register with the expected value. At this time, data that has been read by the "0" read operation at address m is stored in the register at a clock cycle identical to that of the "1" write operation at the address m (m: an integer from 0 and above). And the data that has been read by the "1" read operation at the address m is stored in the register at a clock cycle identical to that of the "0" read operation at the next address; m+1 for ascending address increment, and m−1 for descending.

In a case in which the data read from the memory device by the "1" read operation fails to match the expected value at an address m in diagnosis mode, it is necessary to stop the operation of the BIST in order to observe the fail data, which is needed for the fault diagnosis, to the LSI tester. And after the fail data has been output to the LSI tester, operation of the BIST is resumed. Because of this, the data read from the memory device by the "0" read operation at the address m+1 is not stored in the register during the operation of the BIST is stopped, but is stored in the register after the operation of the BIST has been resumed. Put plainly, the interval from memory data output on the "0" read operation at the address m+1, to the capturing of the data in the register is long compared to a case in which the operation of the BIST is not stopped. Therefore, it may not be possible to detect delay faults, in a case in which there is a delay fault of the memory data output on the "0" read operation at the address m+1. Because of this, there existed a problem of incompleteness of a fail bit map produced from the fault diagnosis results.

Also, with the above stated method, fault is detected after memory output data has once been stored in the register. Because of this, it takes more than 1 clock cycle from memory read operation to fault detection. And the register contents will be overwritten by incoming data read from the memory device before holding the BIST operation. Therefore, in order to observe fail data to the LSI tester it is necessary to prepare a separate register for data preservation. In short, area size of the test circuit increases because of the necessary save-only register.

SUMMARY OF THE INVENTION

An aspect of the present invention inheres in a built-in self test circuit monolithically integrated on a chip with a memory device under test including a capture register configured to store data transmitted from the memory device; an operation controller configured to control operation of the memory device and the capture register; a hold controller configured to execute a hold operation to stop a read operation and a write operation of the memory device by transmitting a hold signal to the operation controller; a test control circuit configured to control the operation controller to transmit a capture signal so that the capture register stores the data to the capture register; a data generator configured to generate data to be written to the memory device and to generate an expected value of the data to be written to the memory device; a comparator configured to compare data stored in the capture register with an expected value of the data, and to transmit a signal when the data fails to match the expected value; a result transmitter configured to accept the signal from the comparator; an address register configured to store an address signal transmitted to the memory device; and an address generator configured to generate the address signal.

DETAILED DESCRIPTION OF THE INVENTION

Various embodiments of the present invention will be described with reference to the accompanying drawings. It is to be noted that the same or similar parts and elements are applied to the same or similar parts and elements through the drawings, and the description of the same or similar parts and elements will be omitted or simplified. In the following descriptions, numerous specific details are set forth such a specific signal values, etc. to provide a thorough understanding of the present invention. However it will be obvious to those skilled in the art that the present invention may be practiced without such specific details. In other instances, well known circuits have been shown in block diagram form in order not to obscure the present invention in unnecessary detail.

(First Embodiment)

Figure 1:
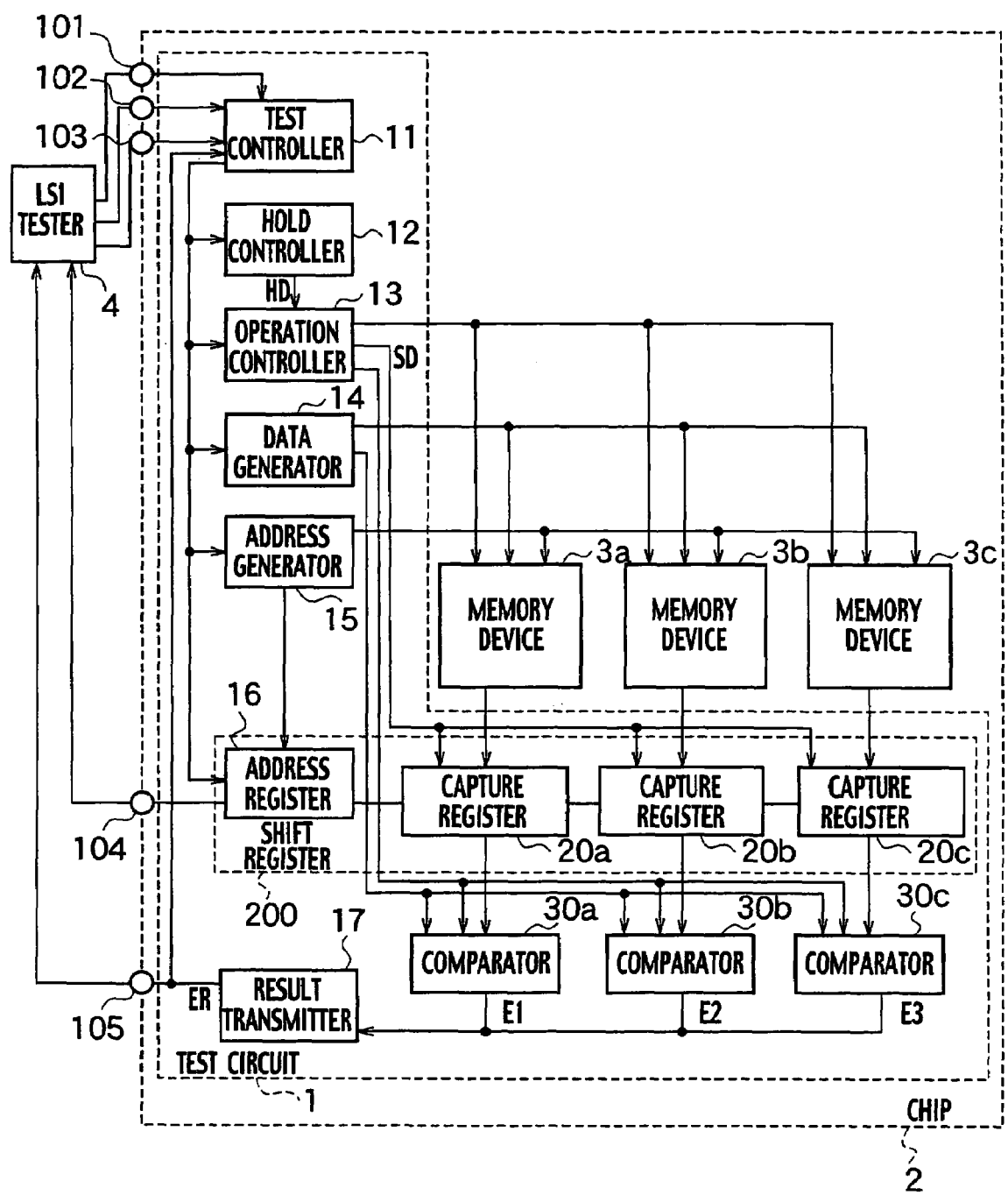
FIG. 1 is a block diagram showing the structure of a test circuit according to an embodiment of the present invention.

The test circuit according to the embodiment of the present invention is a test circuit 1 integrated on the same chip 2 as a plurality of memory devices 3a, 3b, 3c in the FIG. 1. The memory devices 3a, 3b, 3c are the devices under test. The test circuit 1 includes a plurality of capture registers 20a, 20b, 20c, an operation controller 13, a hold controller 12, and a test controller 11. The capture registers 20a, 20b, 20c store data transmitted from the memory devices 3a, 3b, 3c respectively. The operation controller 13 controls operation of the capture registers 20a, 20b, 20c and operation of the memory devices 3a, 3b, 3c. The hold controller 12 transmits a hold signal HD, which asserts a hold operation that stops the write operation and the read operation in the self test of the memory devices 3a, 3b, 3c, to the operation controller 13. The operation controller 13 transmit a capture signal SD, which asserts capturing of data transmitted from the memory devices 3a, 3b, 3c into each of the capture registers 20a, 20b, 20c according to the test controller 11. Furthermore, the test circuit 1 also includes a data generator 14, an address generator 15, an address register 16, a result transmitter 17, and a plurality of comparators 30a, 30b, and 30c.

The test controller 11 is connected to the hold controller 12, the operation controller 13, the data generator 14 and the address generator 15. Further, the hold controller 12 is connected to the operation controller 13. The operation controller 13 is connected to the memory devices 3a, 3b, 3c, the capture registers 20a, 20b, 20c, and the comparators 30a, 30b, 30c. And the data generator 14 is connected to the memory devices 3a, 3b, 3c, and the comparators 30a, 30b, 30c. The address generator 15 is connected to each of the memory devices 3a, 3b, 3c and the address register 16. The result transmitter 17 is connected to the test controller 11, and each of the comparators 30a, 30b, 30c. The capture registers 20a, 20b, 20c and the address register 16 form a shift register 200. The shift register 200 is connected to the test controller 11.

The test controller 11 controls operation of the hold controller 12, the operation controller 13, the data generator 14, the address generator 15, and the shift register 200 in order to perform BIST to test the memory devices 3a, 3b, 3c.

The data generator 14 generates data to be written to the memory devices 3a, 3b, 3c, and transmits data to the memory devices 3a, 3b, 3c. The address generator 15 generates address signals and transmits address signals to the memory devices 3a, 3b, 3c. The memory devices 3a, 3b, 3c include memory cell arrays that have been omitted from the diagrams. Writing or reading of data, from the memory cell array at a uniquely designated memory cell, is executed by an input address signal. And the address generator 15 transmits the address signals, which are transmitted to the memory devices 3a, 3b, 3c, to the address register 16.

And as shown in FIG. 1, the memory device 3a is connected to the capture register 20a. The capture register 20a is connected to the comparator 30a, and the data stored in the capture register 20a is compared to the expected value by the comparator 30a. And the memory device 3b is connected to the capture register 20b. The capture register 20b is connected to the comparator 30b, and the data stored in the capture register 20b is compared to the expected value by the comparator 30b. And the memory device 3c is connected to the capture register 20c. The capture register 20c is connected to the comparator 30c, and the data stored in the capture register 20c is compared to the expected value by the comparator 30c. The expected value is generated at the data generator 14, and transmitted to the comparator 30a, 30b, 30c.

An LSI tester 4 shown in FIG. 1 is connected to a mode switching terminal 101, a stop terminal 102, and a restart terminal 103 of the semiconductor chip 2. The test controller 11 is connected to the mode switching terminal 101, the stop terminal 102, and the restart terminal 103. And the LSI tester 4 is connected to a fail data terminal 104, which is connected to the address register 16. Further, the LSI tester 4 is also connected to a fault flag terminal 105, which is connected to the result transmitter 17.

Before describing the test method according to the test circuit 1 shown in FIG. 1, description concerning the 13N marching test method, one of the test methods generally executed on memory device BIST circuits, will be put forth hereinbelow with reference to FIG. 2.

Figure 2:
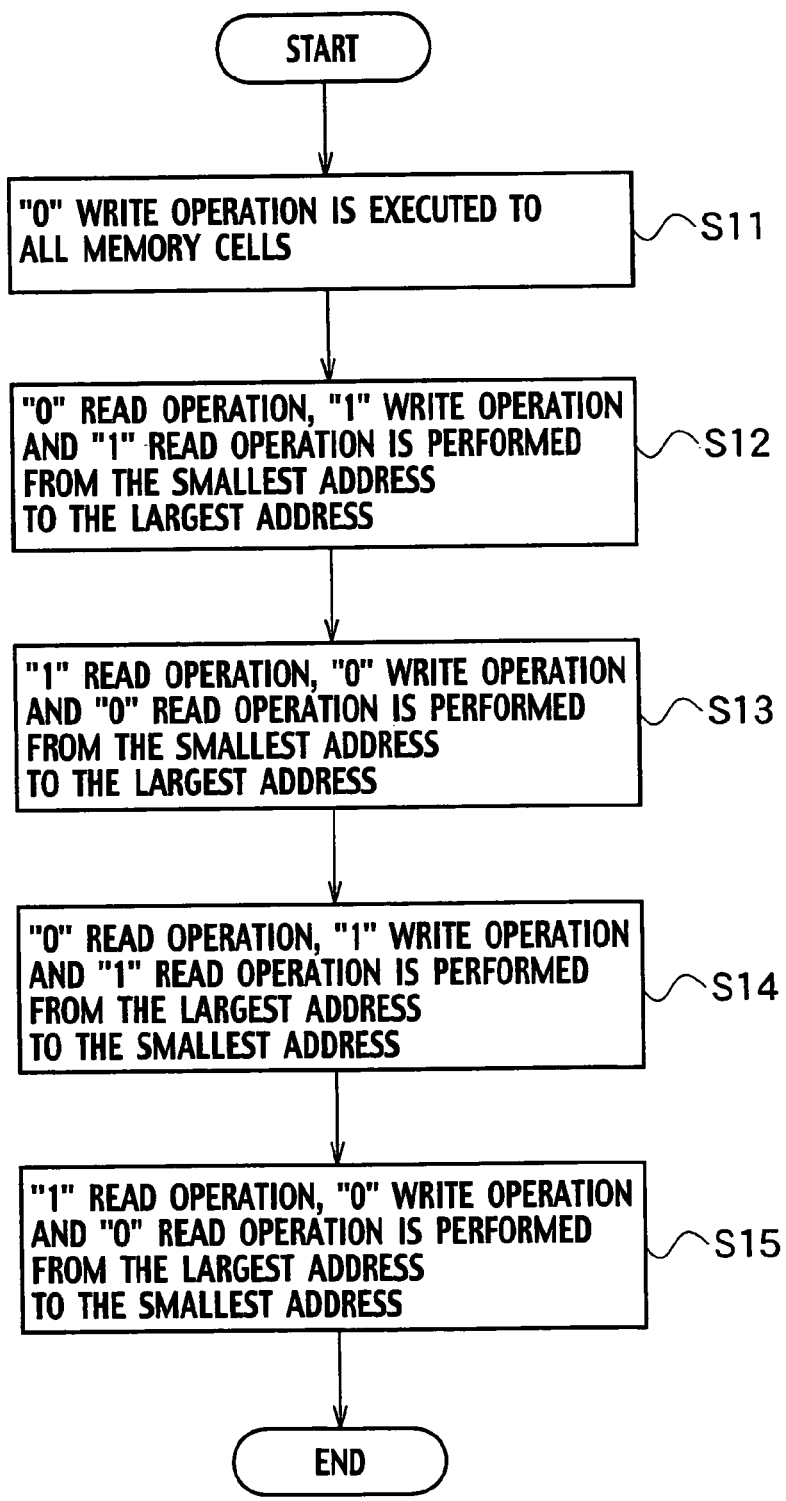
FIG. 2 is a flowchart describing a 13N marching test method.

(a) In a step S11 of FIG. 2, the "0" write operation is performed in ascending order, from the smallest address to the largest address, in all memory cells of the memory device under test.

(b) In a step S12, designating in ascending order, from the smallest address to the largest address, the "0" read operation, the "1" write operation, and the "1" read operation on the memory device under test is performed, and each of the read data is compared to the expected value.

(c) In a step S13, designating in ascending order, from the smallest address to the largest address, the "1" read operation, the "0" write operation, and the "0" read operation on the memory device under test is performed, and each of the read data is compared to the expected value.

(d) In a step S14, designating in descending order, from the largest address to the smallest address, the "0" read operation, the "1" write operation, and the "1" read operation on the memory device under test is performed, and each of the read data is compared to the expected value.

(e) In a step S15, designating in descending order from the largest address to the smallest address, the "1" read operation, the "0" write operation, and the "0" read operation of the memory device under test is performed, and each of the read data is compared to the expected value.

In the above steps S12 to S15, in a case in which the read data fails to match the expected value, the BIST circuit transmits a signal, which shows error detection, to the LSI tester.

As put forth in the above description, in each step S12 to S15 in the 13N marching test method, read operation, writing operation, and read operation is preformed regarding a single address. Afterward, the same operation is repeated, executed regarding the next address. Therefore, in order to describe an example of implementing the 13N marching test method according to the test circuit 1 shown in FIG. 1, it would be acceptable to use the case of the step S12 shown in FIG. 2, for example, having an arbitrary number of addresses n, as an example (n: an integer 0 and above).

Figure 3:
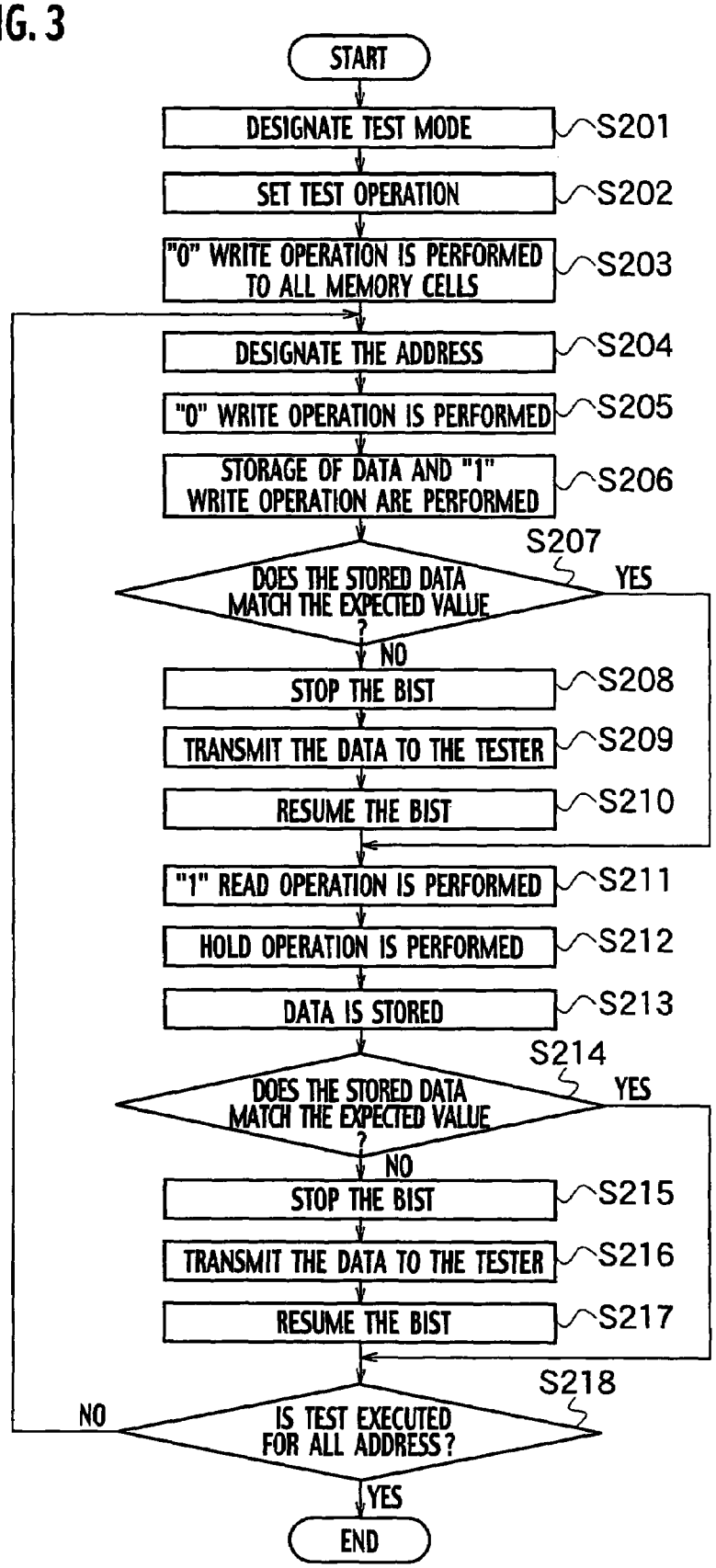
FIG. 3 is a flowchart describing an example of a test method according to the embodiment of the present invention.

An example of a test method that executes fault diagnosis using a BIST applying the 13N marching test method according to the test circuit 1 shown in FIG. 1 is described referencing the flowchart of FIG. 3. Hereinbelow, the case of address n on the step S12 of FIG. 2 is described. In FIG. 3, it is illustrated only to the step S12 of FIG. 2. As has already been put forth, the test controller 11 controls the hold controller 12, operation controller 13, data generator 14, and address generator 15. Put plainly, in the description below, the hold operation, according to the hold controller 12, generation of the data transmitted to the memory devices 3a, 3b, 3c, according to the data generator 14, and generation of the expected value transmitted to the comparators 30a, 30b, 30c, according to the data generator 14, and generation of the address signal, according to the address generator 15, are all executed by the control of the test controller 11. Also, the read operation and write operation of the memory devices 3a, 3b, 3c according to the operation controller 13, storage of data to the capture registers 20a, 20b, 20c according to the operation controller 13, comparison of the expected value to data stored in the capture registers 20a, 20b, 20c according to the comparators 30a, 30b, 30c, and shift operation of the shift register 200, are all executed by the test controller 11.

(a) In a step S201 of FIG. 3, a signal that designates the test mode that executes the fault diagnosis using the BIST is transmitted to the test controller 11 from the LSI tester 4 shown in FIG. 1 through the mode switching terminal 101. "Test mode" can be designated by a person initiating the test, and test operation executed in response to the "test mode" is set by the test controller 11.

Figure 4:
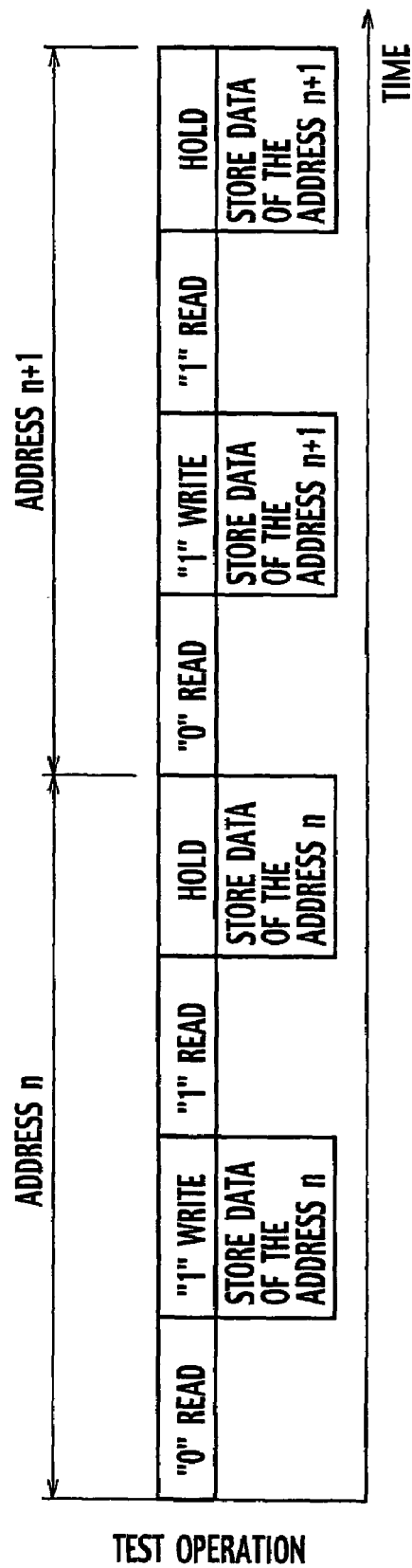
FIG. 4 is a diagram showing an example of test operation of the test method according to the embodiment of the present invention.

(b) In a step S202, the test controller 11 sets the test operation shown in FIG. 4, for example, in response to the designation of the "test mode". Put plainly, test operation is set so that the "0" read operation, the "1" write operation, the "1" read operation, and the hold operation are preformed at each address.

(c) In a step S203, according to a signal from the test controller 11, the operation controller 13, the data generator 14, and the address generator 15 are controlled, and "0" write operation is preformed to all memory cells of the memory devices 3a, 3b, 3c. (d) In a step S204, a signal that designates the address n is generated, and transmitted to the memory devices 3a, 3b, 3c.

(e) In a step S205, the "0" read operation, which reads data of the memory cells of the address n of the memory devices 3a, 3b, 3c, is preformed.

(f) In the step S206, storage of data, and the "1" write operation are preformed. Put simply, the data read from the memory devices 3a, 3b, 3c in the step S205 is stored in each of the capture registers 20a, 20b, 20c. Further, the "1" write operation is preformed in the memory devices 3a, 3b, 3c.

(g) In a step S207, the expected value "0" is transmitted to the comparators 30a, 30b, 30c, and compared to the data stored in the capture registers 20a, 20b, 20c. In the comparator 30a, in a case in which the data stored in the capture register 20a fails to match the expected value, it is determined that a fault has been detected at the memory device 3a, and a signal E1 is transmitted from the comparator 30a to the result transmitter 17. In the comparator 30b, in a case in which the data stored in the capture register 20b fails to match the expected value, it is determined that a fault has been detected at the memory device 3b, and a signal E2 is transmitted from the comparator 30b to the result transmitter 17. In the comparator 30c, in a case in which the data stored in the capture register 20c fails to match the expected value, it is determined that a fault has been detected at the memory device 3c, and a signal E3 is transmitted from the comparator 30c to the result transmitter 17. In a case in which a fault has been detected in any of the comparators 30a, 30b, 30c, the process advances to a step S208. In a case in which a fault has not been detected in any of the comparators 30a, 30b, 30c, the process advances to a step S211.

(h) In the step S208, the fault detection signal ER is transmitted from the result transmitter 17 to the test controller 11. When the fault detection signal ER is accepted, the test controller 11 stops operation of the BIST.

(i) In a step S209, the fault detection signal ER is transmitted to the LSI tester 4 through the fault detection terminal 105. The LSI tester 4 transmits a signal that performs shift operation in the shift register 200. As a result, the address n stored in the address register 16 at the time of fault detection, and the data stored in each of the capture registers 20a, 20b, 20c are transmitted to the LSI tester 4 through the fault data terminal 104. It is possible to determine fault location based on the address n and each data of the memory cells of the address n of the memory devices 3a, 3b, 3c.

(j) In a step S210, the LSI tester 4 transmits a signal, which restarts operation of the BIST, to the test controller 11 through the restart terminal 103, and operation of the BIST is resumed.

(k) In the step S211, the "1" read operation, which reads the data of each of the memory devices 3a, 3b, 3c, is preformed.

(l) In a step S212, hold operation is preformed. Put plainly, according to the hold signal HD transmitted from the hold controller 12, the operation controller 13 is controlled, and the read operation and the write operation of the memory devices 3a, 3b, 3c is stopped.

(m) In a step S213, the capture signal SD is transmitted to the capture registers 20a, 20b, 20c, and the data transmitted from each of the memory devices 3a, 3b, 3c is stored.

(n) In a step S214, the expected value "1" is transmitted to the comparators 30a, 30b, 30c and compared to the data stored in the capture registers 20a, 20b, 20c. In the same manner as in the step S207, in a case in which a fault is detected in any of the comparators 30a, 30b, 30c, the signals E1, E2, E3, respectively, are transmitted to the result transmitter 17. Afterward, the process advances to a step S215. In a case in which a fault is not detected in any one of the comparators 30a, 30b, 30c, the hold operation is released, and the process advances to a step S218.

(o) In the step S215, the fault detection signal ER is transmitted to the test controller 11, stopping operation of the BIST, in the same manner as in the step S208.

(p) In a step S216, the shift register 200 executes shift operation, and the address n stored in the address register 16 at the time a fault was detected, and the data stored in each of the capture registers 20a, 20b, 20c, are transmitted to the LSI tester 4, in the same manner as in the step S209.

(q) In a step S217, the LSI tester 4 transmits a signal, which restarts operation of the BIST, to the test controller 11 through the restart terminal 103. The hold operation is released and operation of the BIST is resumed.

(r) In the step S218, it is determined whether or not testing has been executed for all the addresses. In a case in which testing has been executed for all the addresses, testing is ended. In a case in which there is an address that has not yet been tested, the process returns to the step S204.

In the manner described above, in the step S212 of FIG. 3, after the "1" read operation (first read operation) at the address n, hold operation is executed, and the read operation and write operation of the memory devices 3a, 3b, 3c is stopped. In the step S213, the data transmitted from the memory devices 3a, 3b, 3c is stored in each of the capture registers 20a, 20b, 20c. Put plainly, in the period of time in which operation of the BIST is stopped, and the fault data is being transmitted to the LSI tester 4, the "0" read operation at the address n+1 of the memory devices 3a, 3b, 3c is not executed. After the fault data has been transmitted to the LSI tester 4, operation of the BIST is resumed from the "0" read operation at the address n+1. Because of this, according to the test method using the test circuit 1 shown in FIG. 1, the time from when the signal of "0" read operation at the address n+1 has been transmitted from the operation controller 13 to the memory devices 3a, 3b, 3c, to the time when the data of the memory cells of the address n+1 is stored in the capture registers 20a, 20b, 20c, is the same in a case in which a fault is detected as the time in a case in which a fault is not detected, according to the "1" read operation at the address n.

Also, according to the test circuit 1 shown in FIG. 1, it is possible to set the hold operation at a point in time in the test operation which branch control set beforehand, according to controlling the hold controller 12. In an example in which only BIST is executed according to the test circuit 1 shown in FIG. 1, and the fault diagnosis is not executed, because there is no need to stop operation of the BIST, test operation can be set to not execute the hold operation shown in the FIG. 5. Put plainly, the data transmitted from the memory devices 3a, 3b, 3c according to the "1" read operation at the address n is stored in the capture registers 20a, 20b, 20c at the same clock cycle as the "0" read operation at the address n+1. By setting the test operation so as to not execute the hold operation of the type shown in FIG. 5, it is possible to shorten the time required for the BIST.

Figure 6:
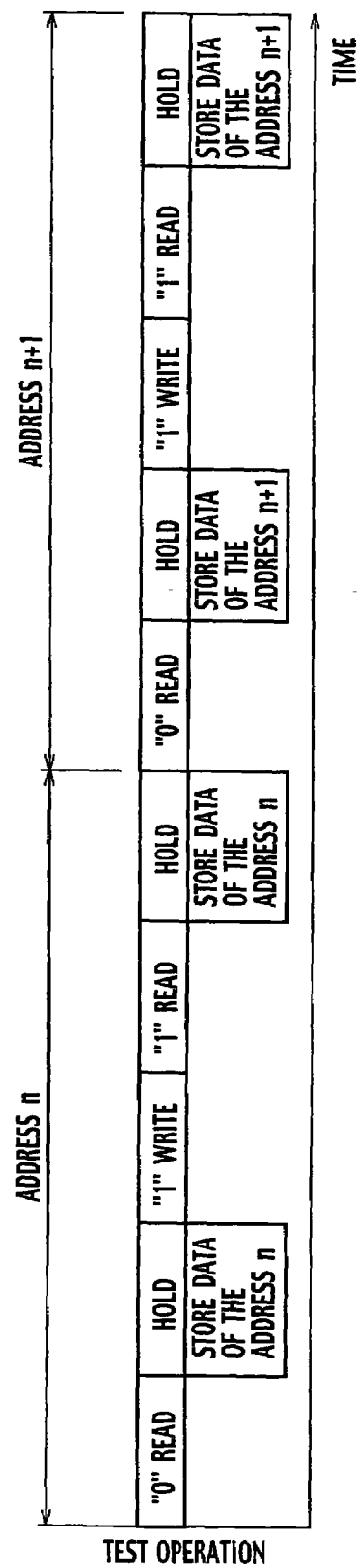
FIG. 6 is a diagram showing yet another example of test operation of the test method according to the embodiment of the present invention.

On the other hand, it is also possible to set the hold operation after the "0" read operation, as shown in FIG. 6. Put plainly, the "1" write operation is not executed in the period of time in which operation of the BIST is stopped in the step S208 shown in the FIG. 3. The data transmitted from the memory devices 3a, 3b, 3c according to the "0" read operation is stored in the capture registers 20a, 20b, 20c during the hold operation. However, the next test operation of the "0" read operation, different from the case of the "1" read operation, is "1" write operation, not read operation. Because of this, even in a case in which the hold operation is not set after the "0" read operation, the problem of the data transmitted from the memory devices 3a, 3b, 3c not able to be captured into the capture registers 20a, 20b, 20c during the cessation of operation of the BIST does not occur. Therefore, because test time is short, the hold operation does not have to be set after the "0" read operation.

In the above description, an example of a case in which the step S12 of the 13N marching test method shown in FIG. 2 is executed has been described. Even in the case of the step S13 to the step S15 of FIG. 2, it is possible to execute in the same manner as that of the step S12. For example, in the case of the step S13, the "1" read operation, the "0" write operation, and the "0" read operation are executed in ascending order from the smallest to the largest address. Therefore, after the "0" read operation (first read operation) at the address n, the "1" read operation at the address n+1 is executed next. By setting the hold operation in between the "0" read operation at the address n and the "1" read operation at the address n+1, the "1" read operation at the address n+1 is not executed during cessation of operation of the BIST in which a fault has been detected in the "0" read operation at the address n. Then operation of the BIST is resumed from the "1" read operation at the address n+1. Because of this, the time from when the "1" read operation at the address n+1 has been transmitted from the operation controller 13 to the memory devices 3a, 3b, 3c, to the time when the data transmitted from the memory devices 3a, 3b, 3c is stored in the capture registers 20a, 20b, 20c, is the same in a case in which a fault is detected as the time in a case in which a fault is not detected. The same applies to the steps S14 and S15 of FIG. 2.

As has already been put forth, in order to set the hold operation, the LSI tester 4 shown in FIG. 1 transmitted the mode designating signal to the test controller 11 through the mode switching terminal 101. The hold controller 12 executes the hold operation at already captured test timing according to the test controller 11, in response to the designated mode. For example, in a case in which the steps S11 to S15, of the 13N marching test method shown in FIG. 2, are executed in sequence, it is possible to transmit the mode designating signal from the LSI tester 4 to the test controller 11 at each step, and perform testing that executes the hold operation at a different timing for each step.

Figure 5:
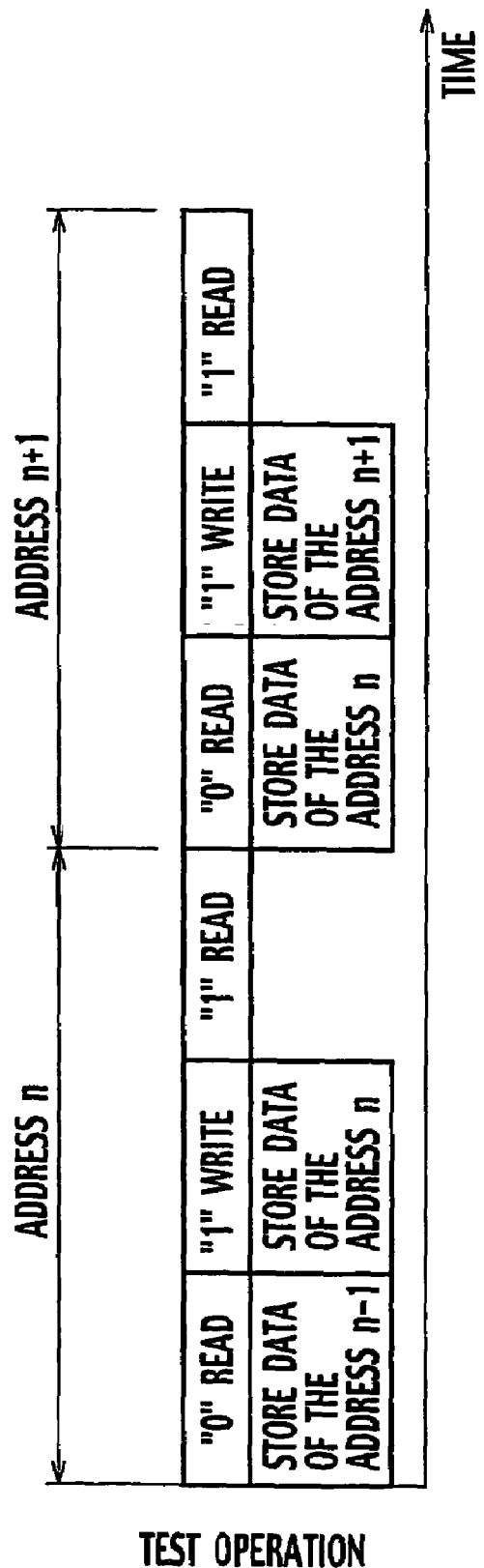
FIG. 5 is a diagram showing another example of test operation of the test method according to the embodiment of the present invention.
Figure 7:
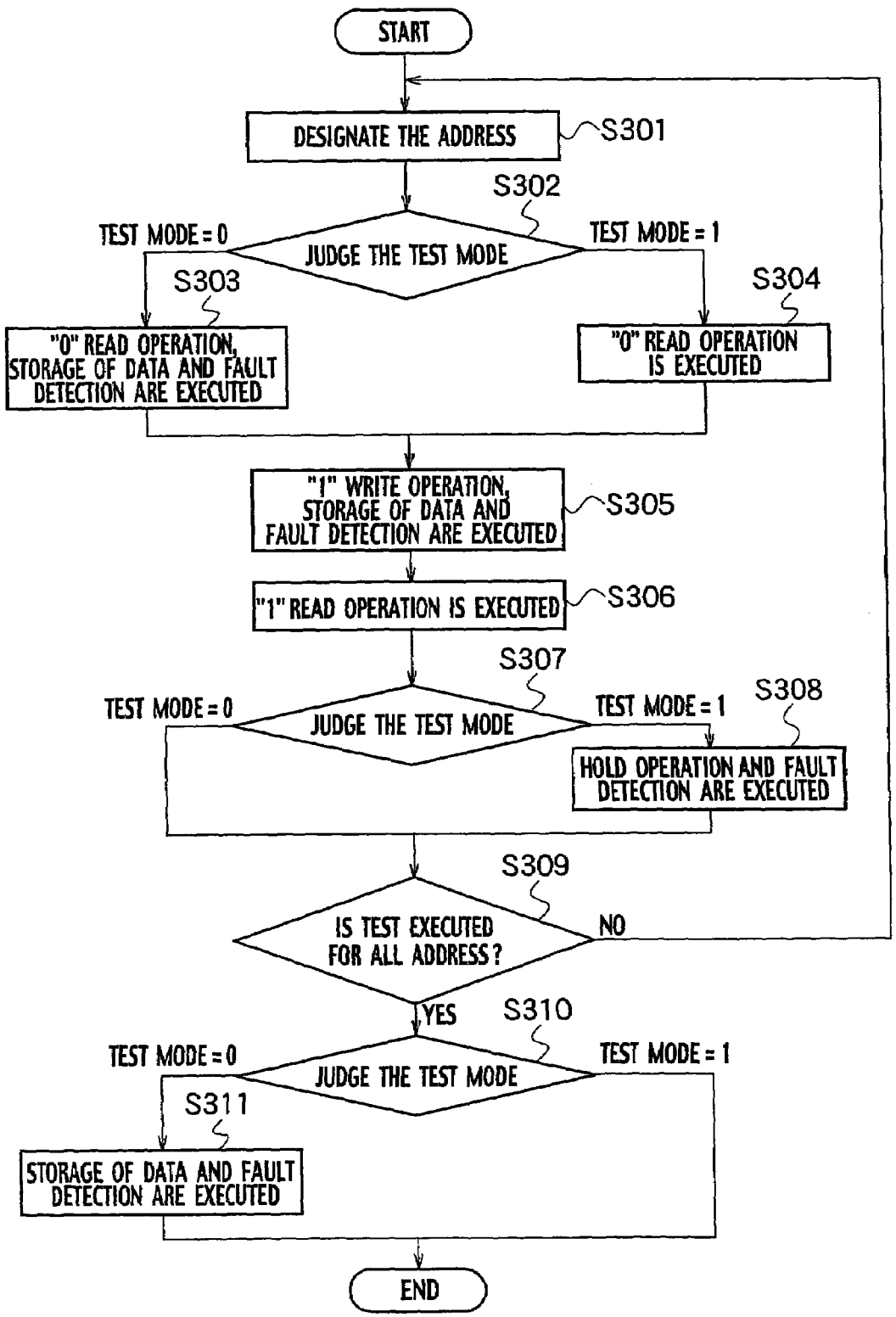
FIG. 7 is a flowchart describing an example of a method of controlling test operation with a test mode for the test method of the embodiment of the present invention.

Following the input test mode, an example of executing test operation shown in FIG. 4, or test operation shown in FIG. 5, according to the test controller 11 shown in FIG. 1, is shown in FIG. 7. In the example shown in FIG. 7, because only the BIST is executed at the test mode=0, the test operation shown in FIG. 5, which does not set the hold operation, is executed. On the other hand, at the test mode=1, in order to execute the fault diagnosis using the BIST, the test operation shown in FIG. 4, which executes the hold operation after the "1" read operation, is executed. Below, a method of controlling the test operation shown in FIG. 7, according to the test circuit 1 shown in FIG. 1 is described. In the description below, generation of the data and the address, the write operation and read operation of the memory devices 3a, 3b, 3c, the fault detection method, and the operation in a case in which a fault is detected, are identical to that of the description of FIG. 3, and thus will be omitted.

(a) In a step S301 of FIG. 7, the signal that designates the address n is transmitted to the memory devices 3a, 3b, 3c.

(b) In a step S302, the test mode is judged. In a case in which the test mode=0, the process advances to a step S303. In a case in which the test mode=1, the process advances to a step S304.

(c) In a step S303, the data transmitted from memory devices 3a, 3b, 3c according to the "1" read operation at the address n−1 of the memory devices 3a, 3b, 3c, is stored in each of the capture registers 20a, 20b, 20c, and fault detection is executed. And "0" read operation is preformed, and all the data of the memory cells of the address n of the memory devices 3a, 3b, 3c is read. Afterward, the process advances to a step S305.

(d) In the step S304, the "0" read operation is executed, and all the data of the memory cells of the address n of the memory devices 3a, 3b, 3c is read. Afterward, the process advances to the step S305.

(e) In the step S305, the "1" write operation at the address n of the memory devices 3a, 3b, 3c is executed. Further, the data of the memory cells of the address n transmitted from the memory devices 3a, 3b, 3c according to the "0" read operation in the steps S303 or S304 is stored in each of the capture registers 20a, 20b, 20c, and the fault detection is executed.

(f) In a step S306, the "1" read operation is executed, and all the data of the memory cells of the address n of the memory devices 3a, 3b, 3c is read.

(g) In a step S307, the test mode is judged. In a case in which the test mode=0, the process advances to a step S309. In a case in which the test mode=1, the process advances to a step S308.

(h) In the step S308, the hold operation is executed, and the data of the memory cells of the address n transmitted from the memory devices 3a, 3b, 3c according to the "1" read operation in the step S306 is stored in each of the capture registers 20a, 20b, 20c, and fault detection is executed.

(i) In the step S309, it is determined whether or not testing has been executed for all the addresses. In a case in which testing has been executed for all the addresses, the process advances to a step S310. In a case in which there is an address that has not yet been tested, the process returns to the step S301

(j) In the step S310, the test mode is judged. In a case in which the test mode=0, the process advances to a step S311 In a case in which the test mode=1, the test completes.

(k) In the step S311, the data of the memory cells of the address n transmitted from the memory devices 3a, 3b, 3c according to the "1" read operation in the step S306 is stored in each of the capture registers 20a, 20b, 20c, and the fault detection is executed. Afterward, the test completes.

In a case in which a fault is detected at the test mode=1, operation of the BIST is stopped according to methods described using FIG. 3, and the fail data is transmitted to the LSI tester 4.

As has been described hereinabove, according to the test circuit 1 shown in FIG. 1, in a case in which the "0" read operation and the "1" read operation are executed in succession, or in cases in which the "1" read operation and the "0" read operation are executed in succession, according to setting the hold operation during the successive read operations, it is possible to equalize the time from when the read operation signal has been transmitted from the operation controller 13 to the memory devices 3a, 3b, 3c, to the time when the data transmitted from the memory devices 3a, 3b, 3c is stored in the capture registers 20a, 20b, 20c. Also, according to designating the test mode, it is possible to execute the hold operation at a point in the time in the test operation which branch control set beforehand. Also, during the hold operation, the read operation of the memory devices 3a, 3b, 3c is not executed, and the next data is not captured in the capture registers 20a, 20b, 20c. Because of this, it is unnecessary to prepare the saving-use register separate to the capture registers 20a, 20b, 20c, and it is possible to suppress increases in area of the test circuit 1.

Further, although the case of testing the three memory devices 3a, 3b, 3c with the test circuit 1 has been described as an example, it is a matter of course that the number of memory devices being simultaneously tested by the test circuit 1 is not limited to 3. It is also acceptable to integrate a plurality of the test circuit 1 on the chip 2.

[Modification]

Figure 8:
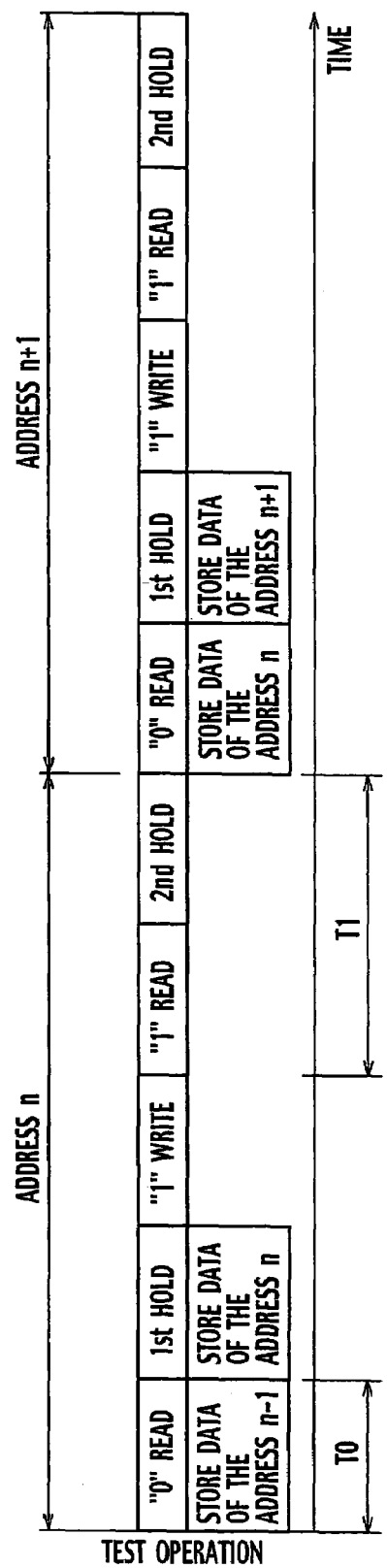
FIG. 8 is a diagram showing an example of test operation according to a test method according to a modification of the embodiment of the present invention.
Figure 9:
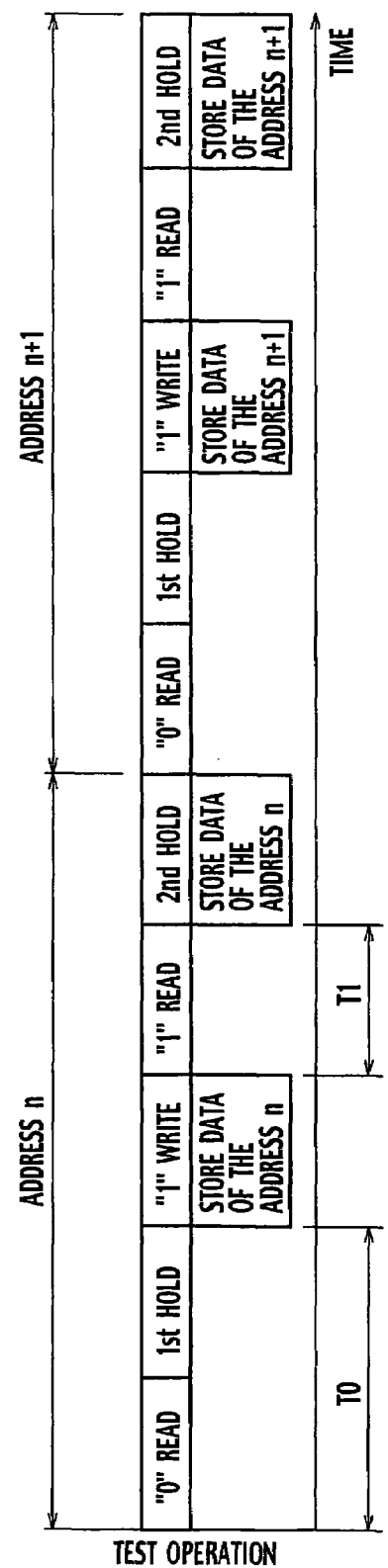
FIG. 9 is a diagram showing an example of another test operation executed with the test method according to the modification of the embodiment of the present invention.

An example of the setting of the test operation executed according to the test circuit 1 shown in FIG. 1 is shown in FIGS. 8 and 9. In the test operation shown in FIG. 8, a first hold operation is executed after the "0" read operation at the address n. In the first hold operation, the data transmitted from the memory devices 3a, 3b, 3c during the "0" read operation at the address n is stored in each of the capture registers 20a, 20b, 20c. Next, after the "1" read operation at the address n, a second hold operation is executed. Afterward, in the "0" read operation at the address n+1, the data transmitted from the memory devices 3a, 3b, 3c during the "1" read operation at the address n is stored in each of the capture registers 20a, 20b, 20c, which differs from the test operation shown in FIG. 4.

According to the test operation shown in FIG. 8, a time T0, which is the amount of time from when the signal of "0" read operation at the address n has been transmitted to the memory devices 3a, 3b, 3c, to the time when the data of the memory cells of the address n is stored in the capture registers 20a, 20b, 20c, is different than a time T1, which is the time from when the signal of "1" read operation at the address n has been transmitted to the memory devices 3a, 3b, 3c, to the time when the data of the memory cells of the address n is stored in the capture registers 20a, 20b, 20c. In the test operation of FIG. 8, the T0 is less than the T1 (T0<T1).

On the other hand, in the test operation shown in FIG. 9, the first hold operation is executed after the "0" read operation at the address n. In the first hold operation, the data transmitted from the memory devices 3a, 3b, 3c during the "0" read operation at the address n is stored in each of the capture registers 20a, 20b, 20c. Next, after the "1" read operation at the address n, a second hold operation is executed. In the second hold operation, the data transmitted from the memory devices 3a, 3b, 3c during the "1" read operation at the address n is stored in each of the capture registers 20a, 20b, 20c, which differs from the test operation shown in FIG. 4 and FIG. 8. In the test operation of FIG. 9, the T0 is greater than the T1 (T0>T1).

By setting the test operation shown in FIG. 8 or FIG. 9, it is possible to set a difference between the time T0 and the time T1. As a result, according to executing the BIST with the test operation shown in FIG. 8 for example, it is possible to execute a test that can detect delay faults in propagating time of the data in the "0" read operation more easily than delay faults in propagating time of the data in the "1" read operation of the memory devices 3a, 3b, 3c. On the other hand, by executing the BIST with the test operation shown in FIG. 9, it is possible to execute a test that can detect delay faults in propagating time of the data in the "1" read operation more easily than delay faults in propagating time of the data in the "0" read operation of the memory devices 3a, 3b, 3c. Put plainly, it is possible to investigate on which operating part of the memory devices 3a, 3b, 3c faults are easily generated, as well as shorten time required for the fault diagnosis, with the test that does not execute the fault diagnosis, but only executes the BIST.

Setting of the test operation can be performed by transmitting the mode designating signal from the LSI tester 4 to the test controller 11, as has already been put forth. Because it is possible to execute the hold operation at a point in time in the test operation which branch control set beforehand, it is possible to even further enlarge the difference between the time T0 and the time T1, according to executing the hold operation successively in the test operation shown in FIGS. 8 and 9, for example.

Other Embodiments

In the already put forth description of the embodiment, although the signal from the LSI tester 4 has been transmitted to the test controller 11, it is possible to execute the hold operation by the signal transmitted from the LSI tester 4 to the hold controller 12. Also, in the already put forth description of the embodiment, although an example of the test controller 11 setting the test operation corresponding to the test mode has been shown, it is also acceptable to control operation of the BIST circuit according to the signal from the LSI tester 4 at every clock cycle.

Various modifications will become possible for those skilled in the art after receiving the teachings of the present disclosure without departing from the scope thereof.

What is claimed is:

1. A built-in self test circuit monolithically integrated on a chip with a memory device under test comprising:
   a capture register configured to store data transmitted from the memory device;
   an operation controller configured to control operation of the memory device and the capture register;
   a hold controller configured to execute a hold operation to stop a read operation and a write operation of the memory device by transmitting a hold signal to the operation controller when a fault is detected at the memory device;
   a test control circuit configured to control the operation controller to transmit a capture signal so that the capture register stores the data to the capture register;
   a data generator configured to generate data to be written to the memory device and to generate an expected value of the data to be written to the memory device;
   a comparator configured to compare data stored in the capture register with an expected value of the data, and to transmit a signal when the data fails to match the expected value;
   a result transmitter configured to accept the signal from the comparator;
   an address register configured to store an address signal transmitted to the memory device; and
   an address generator configured to generate the address signal.

2. The test circuit of claim 1, wherein the result transmitter transmits a fault detection signal to the test control circuit when the result transmitter accepts the signal transmitted from the comparator.

3. The test circuit of claim 1, wherein data stored in the capture register and the address signal are transmitted from the test circuit when a fault is detected at the memory device.

4. The test circuit of claim 3, wherein a fault location on the memory device is determined based on the address signal and the data stored in the capture register.

5. The test circuit of claim 1, wherein the address register and the capture register implement a shift register.

6. The test circuit of claim 5, wherein the shift register performs a shift operation and transmits the address signal and the data stored in the capture register when a fault is detected at the memory device.

* * * * *